(12) United States Patent
Kuo et al.

(10) Patent No.: US 10,242,899 B2
(45) Date of Patent: Mar. 26, 2019

(54) WAFER CASSETTE

(71) Applicant: CHIPBOND TECHNOLOGY CORPORATION, Hsinchu (TW)

(72) Inventors: Chien-Ming Kuo, Hsinchu (TW); Hung-Ching Chang, Hsinchu (TW)

(73) Assignee: CHIPBOND TECHNOLOGY CORPORATION

( * ) Notice: Subject to any disclaimer, the term of this patent is extended or adjusted under 35 U.S.C. 154(b) by 143 days.

(21) Appl. No.: 15/456,652

(22) Filed: Mar. 13, 2017

(65) Prior Publication Data

US 2018/0211860 A1    Jul. 26, 2018

(30) Foreign Application Priority Data

Jan. 20, 2017    (TW) .............................. 106102281 A

(51) Int. Cl.
| | |
|---|---|
| *H01L 21/00* | (2006.01) |
| *H01L 21/677* | (2006.01) |
| *H01L 21/673* | (2006.01) |

(52) U.S. Cl.
CPC ........ *H01L 21/67766* (2013.01); *H01L 21/00* (2013.01); *H01L 21/67379* (2013.01); *H01L 21/67383* (2013.01); *H01L 21/67769* (2013.01); *H01L 21/67778* (2013.01)

(58) Field of Classification Search
USPC ......... 206/710, 711, 712; 414/935, 936, 940
See application file for complete search history.

(56) References Cited

U.S. PATENT DOCUMENTS

| | | | | |
|---|---|---|---|---|
| 6,092,981 | A * | 7/2000 | Pfeiffer | ............. H01L 21/67303 |
| | | | | 206/710 |
| 6,366,102 | B1 | 4/2002 | Ishimoto | |
| 7,857,139 | B2 * | 12/2010 | Contes | .............. H01L 21/67369 |
| | | | | 206/710 |
| 8,800,774 | B2 * | 8/2014 | Bonora | ............. H01L 21/67383 |
| | | | | 206/710 |
| 2011/0076117 | A1 * | 3/2011 | Iizuka | ................. H01L 21/6719 |
| | | | | 414/217 |

FOREIGN PATENT DOCUMENTS

| | | |
|---|---|---|
| JP | 4-142758 A | 5/1992 |
| JP | 7-294750 A | 11/1995 |
| JP | 8-217172 A | 8/1996 |
| JP | 10-321680 A | 12/1998 |
| JP | 2003-218194 A | 7/2003 |
| JP | 2004-79738 A | 3/2004 |
| JP | 2013-157395 A | 8/2013 |
| KR | 10-1475507 | 12/2014 |

OTHER PUBLICATIONS

Japanese Office Action dated Oct. 2, 2017 for Japanese Patent Application No. 2017-048298, 4 pages.
Korean Office Action dated Mar. 26, 2018 for Korean Patent Application No. 10-2017-0031030, 10 pages.
Taiwanese Office Action dated Dec. 6, 2018 for Taiwanese Patent Application No. 106102281, 9 pages.

* cited by examiner

*Primary Examiner* — Jacob K Ackun

(74) *Attorney, Agent, or Firm* — Jackson IPG PLLC; Demian K. Jackson

(57) ABSTRACT

A wafer cassette for storing wafers comprises a case and a plurality of carriers for carrying the wafers. Each of the carriers is pivotally and movably mounted to a pivot of the case, and can selectively accommodate in or depart from an accommodation space of the case for benefit of the wafer loading or unloading.

20 Claims, 6 Drawing Sheets

WAFER CASSETTE

FIELD OF THE INVENTION

This invention relates to a wafer cassette for storing semiconductor wafers.

BACKGROUND OF THE INVENTION

In order to protect a wafer during semiconductor manufacturing process, the wafer is deposited in a wafer cassette for storing or transporting.

The wafer is conventionally deposited in an accommodation groove of the wafer cassette, and it can be loaded and unloaded in vertical or horizontal way. But no matter in which way, it is not easy for the operator or robotic arm to take the wafer.

In terms of vertical way, the wafer has to be taken in vertical way because the wafer is deposited upright in the accommodation groove, otherwise the wafer is prone to touch the adjacent wafer and crack during taking the wafer. And improper taking will cause the wafer to fall down and break while loading or unloading.

In terms of horizontal way, the wafer is deposited in the accommodation groove horizontally, so the wafer will be rubbed against the wafer cassette while drawing out. Likewise, the improper taking also will cause the wafer to fall down and break.

SUMMARY

The primary object of the present invention is to provide a plurality of carriers mounted to a pivot of a case pivotally and movably to lead a carrying base of each of the carriers selectively accommodate in an accommodation space of the case or depart from the accommodation space for benefits of wafer loading and unloading.

A wafer cassette of the present invention comprises a case and a plurality of carriers, the case includes a pivot and an accommodation space, and each of the carriers includes a pivotal hole and a carrying base for carrying a wafer, wherein each of the carriers is pivotally and movably mounted to the pivot through the pivotal hole, and each of the carriers selectively pivots around the pivot to lead the carrying base to accommodate in the accommodation space or depart from the accommodation space.

Owing to the carrier of the present invention is pivotally and movably mounted to the pivot, it can pivot around the pivot and lead the carrying base to depart from the accommodation space for revealing the carrying base and loading the wafer on the carrying base when intending to load the wafer. After loading the wafer on the carrying base, the carrier can pivot around the pivot again to lead the wafer followed with the carrying base to accommodate in the accommodation space.

When intending to unload the wafer on the carrying base, the carrier can pivot around the pivot and lead the carrying base depart from the accommodation space for revealing and unloading the wafer on the carrying base.

The wafer cassette of the present invention can separately reveal the carrying bases from the case by the carriers which are pivotally and movably mounted to the pivot, therefore wafer damage or falling down due to the collision of the adjacent wafers during loading or unloading is preventable.

DETAILED DESCRIPTION OF THE INVENTION

Figure 1:
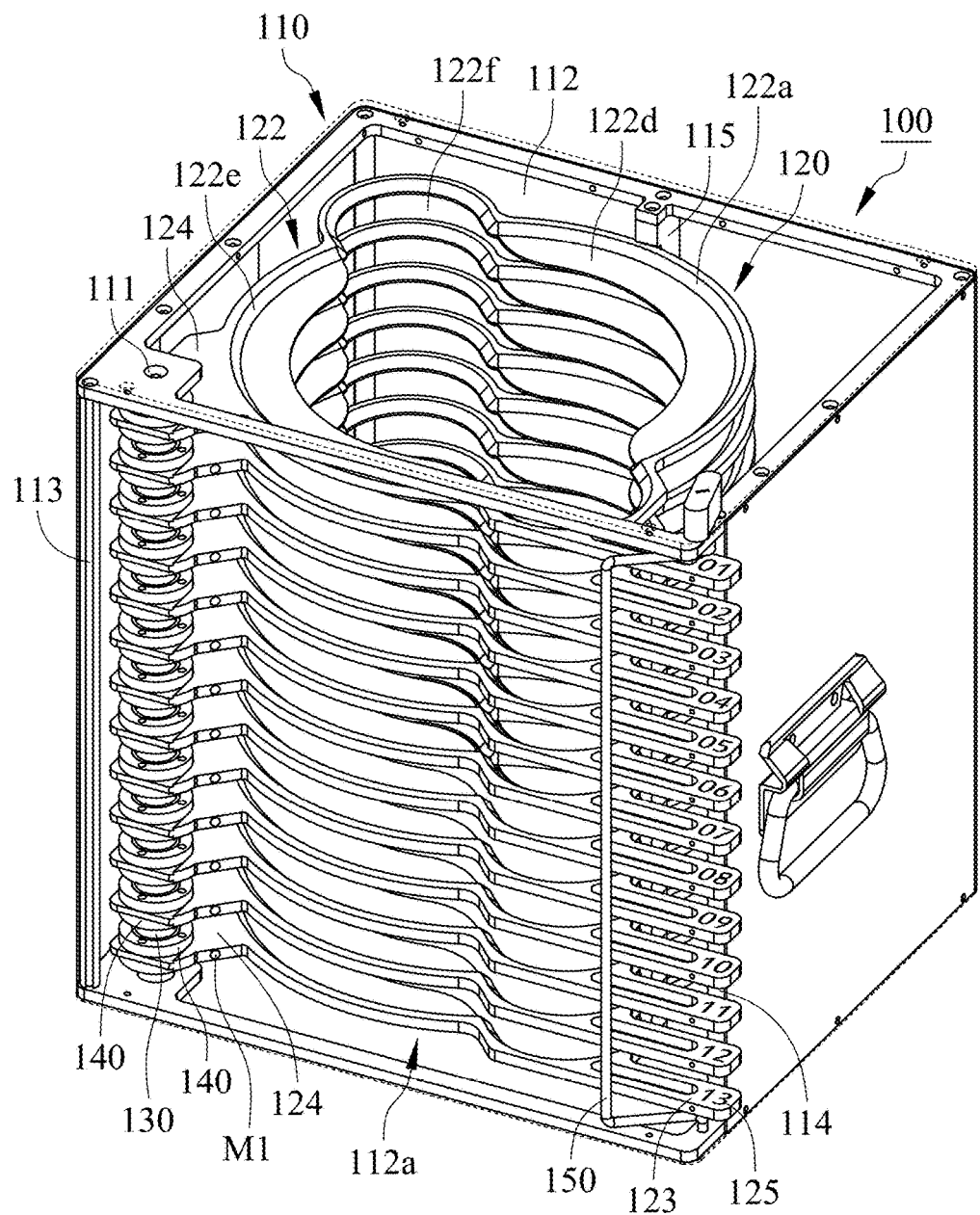
FIG. 1 is a perspective view drawing illustrating a wafer cassette in accordance with an embodiment of the present invention.
Figure 2:
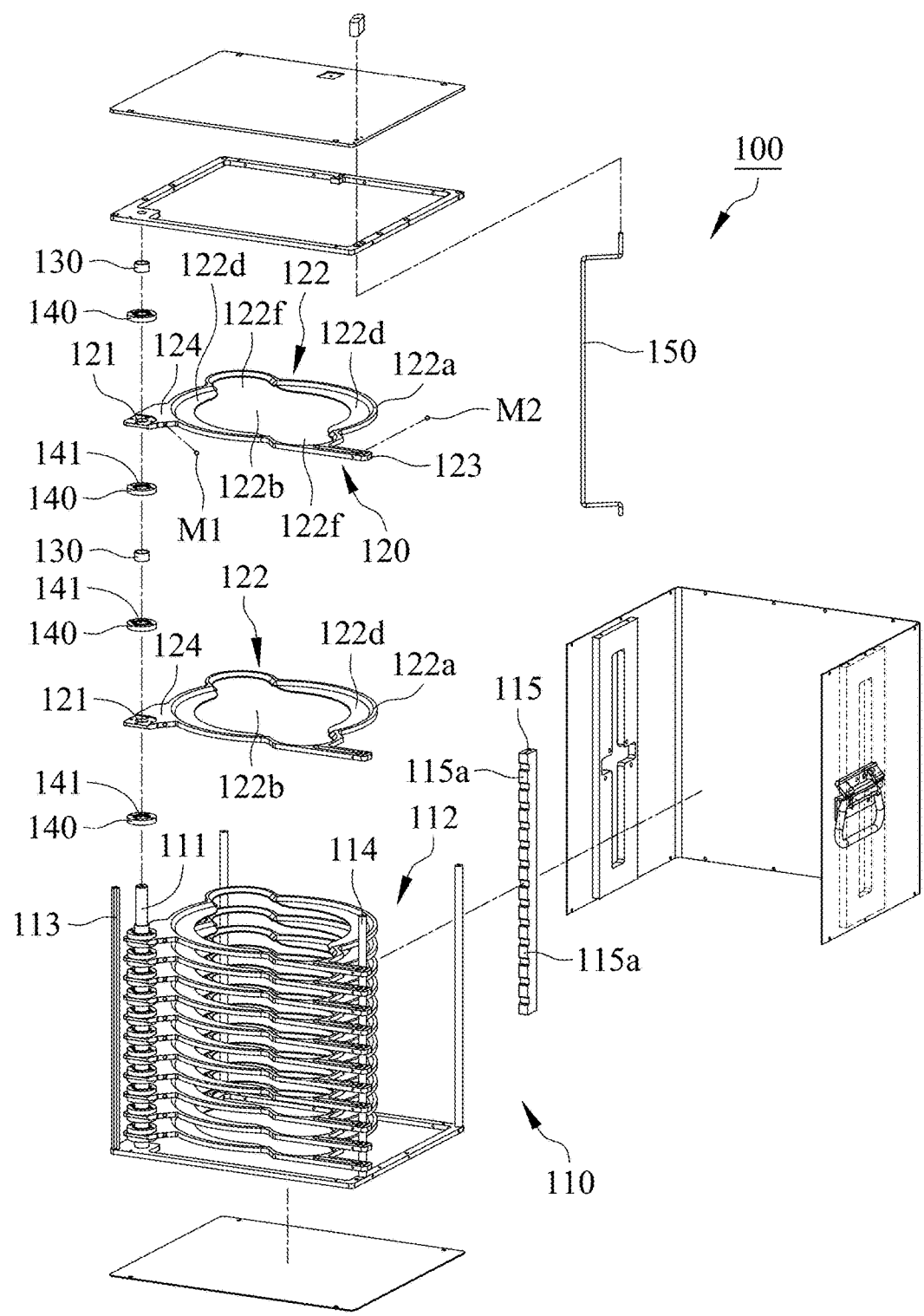
FIG. 2 is an exploded view drawing illustrating the wafer cassette in accordance with the embodiment of the present invention.
Figure 3:
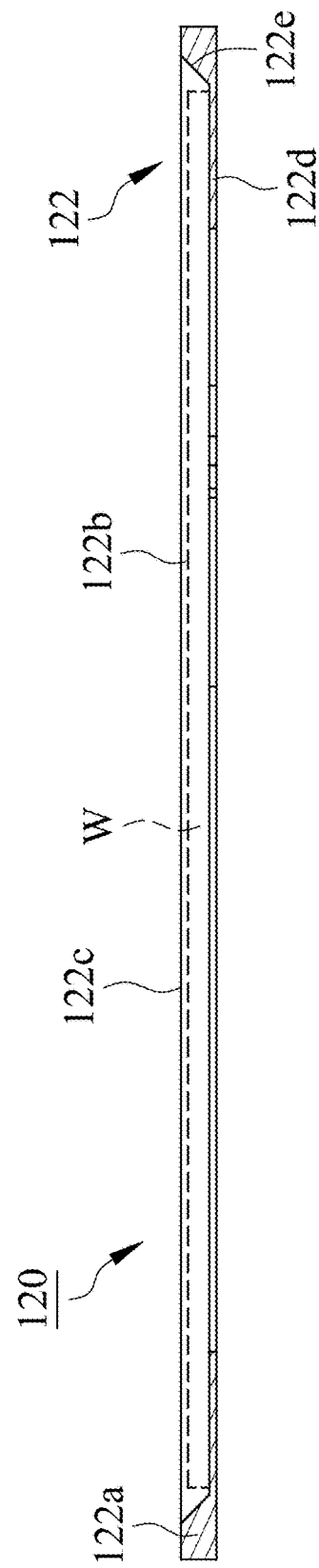
FIG. 3 is a cross-sectional view diagram illustrating a carrying base of the wafer cassette in accordance with the embodiment of the present invention.

With reference to FIGS. 1, 2 and 3, a wafer cassette 100 of the present invention for storing a plurality of wafers W comprises a case 110 and a plurality of carriers 120. The case 110 includes a pivot 111 and an accommodation space 112, and each of the carriers 120 includes a pivotal hole 121 and a carrying base 122, wherein the carrying base is for carrying the wafer W (please referring to FIG. 3). Each of the carriers 120 is pivotally and movably mounted to the pivot 111 through the pivotal hole 121, and selectively pivots around the pivot 111 to lead the carrying base 122 to accommodate in the accommodation space 112 or depart from the accommodation space 112. Preferably, a mark 125 is located on each of the carriers 120, wherein the mark 125 can be a counting mark, like number, and it is beneficial for operators to recognize without counting one by one.

With reference to FIGS. 2, 3, 4 and 5, the carrying base 122 includes a frame 122a and an accommodation groove 122b, wherein the frame 122a surrounds the accommodation groove 122b. Each of the carriers 120 includes a pivotal portion 124 which connects with the frame 122a of the carrying base 122, wherein the pivotal hole 121 is located on the pivotal portion 124.

Figure 4:
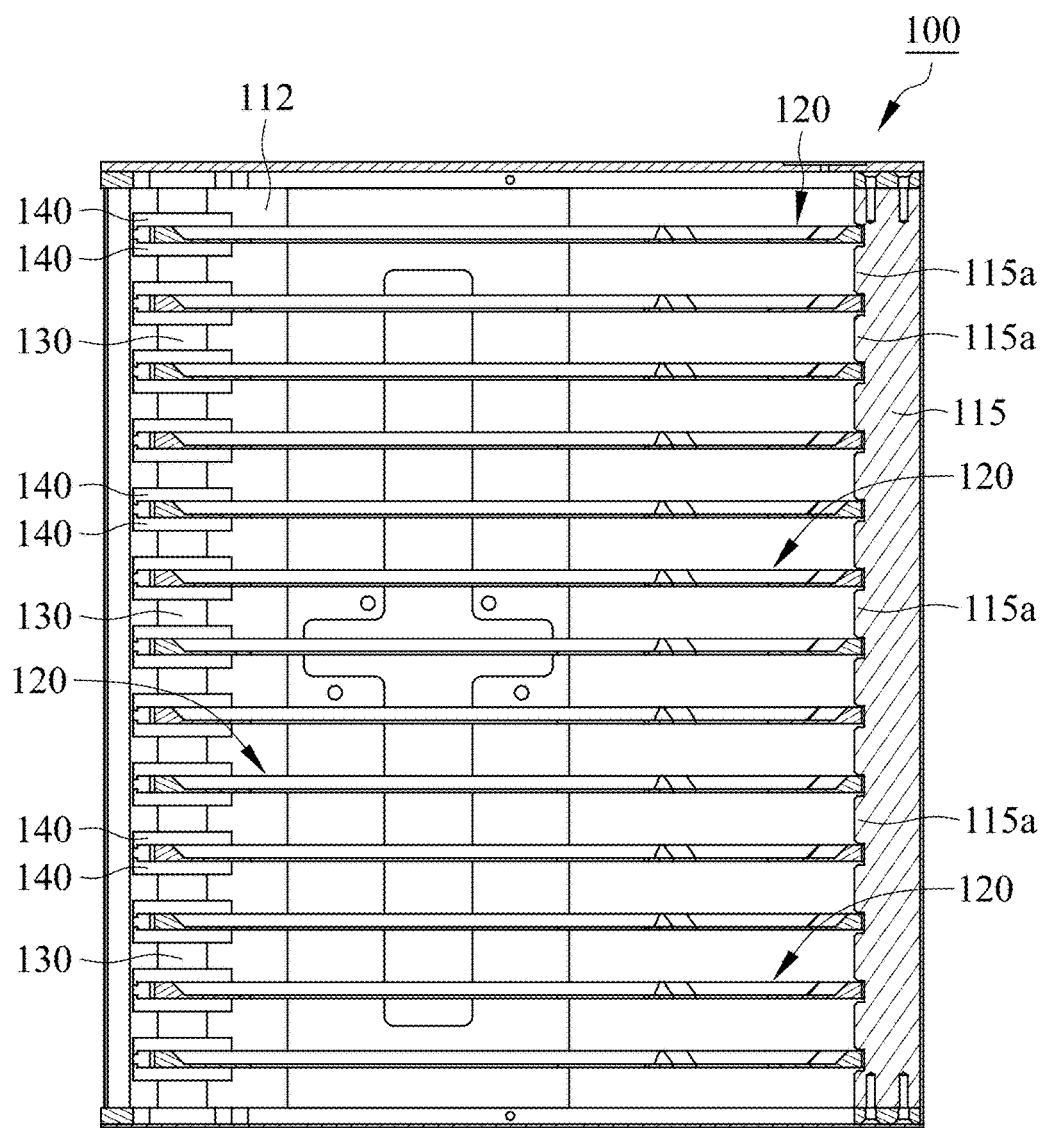
FIG. 4 is a cross-sectional view diagram illustrating the wafer cassette in accordance with the embodiment of the present invention.
Figure 5:
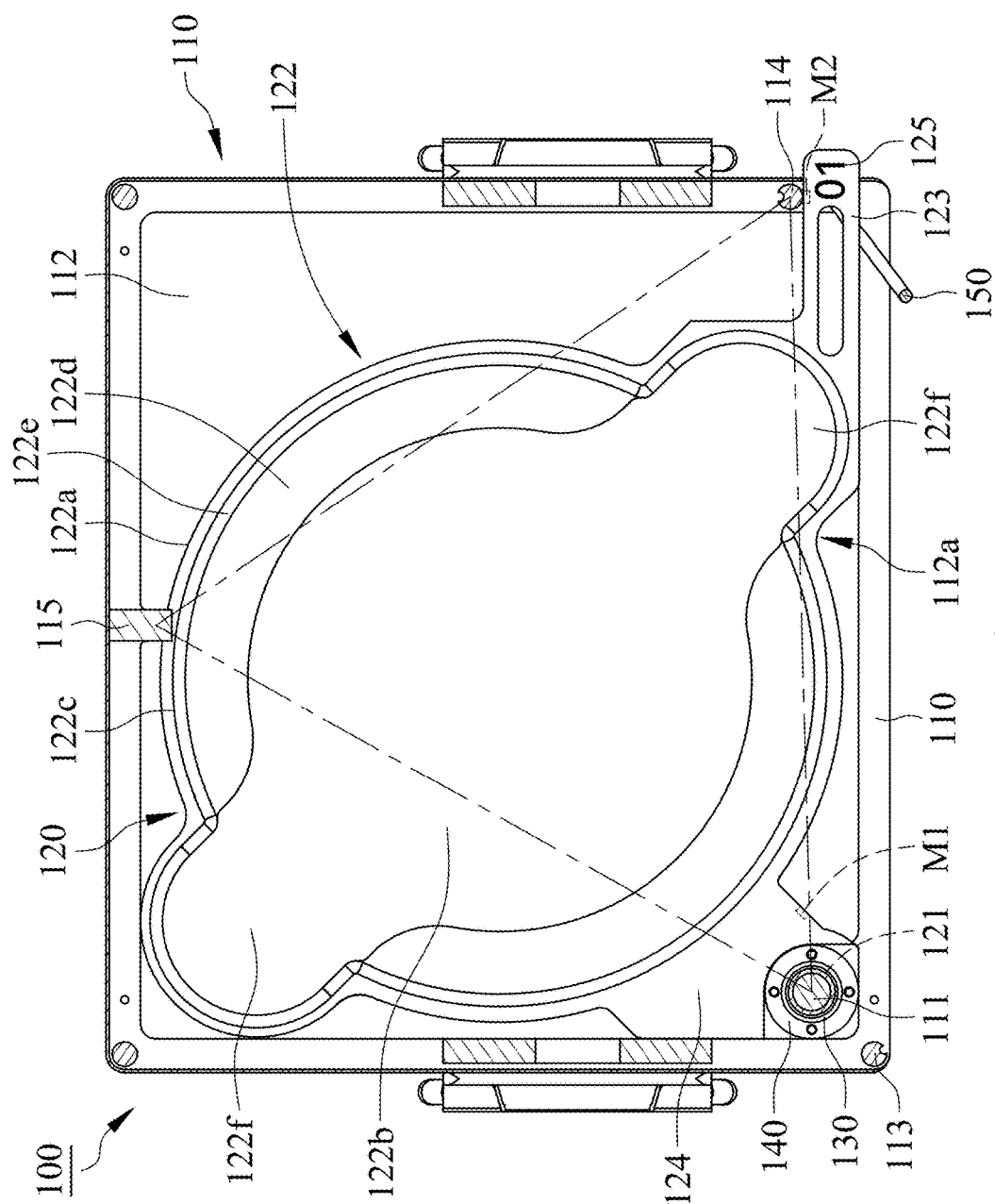
FIG. 5 is an operation diagram illustrating the wafer cassette in accordance with the embodiment of the present invention.

With reference to FIGS. 2, 4 and 5, the wafer cassette 100 comprises a plurality of spacers 130 and a plurality of bearings 140 in this embodiment, wherein each of the spacers 130 is mounted on the pivot 111 and positioned between each adjacent pair of the carriers 120, and each of the bearings 140 is coupled with the pivotal portion 124 of the carrier 120 and includes a through hole 141. In this embodiment, each of the bearings 140 is positioned on the pivotal portion 124 with a connector (not shown, e.g. screw). The through hole 141 is corresponding to the pivotal hole 121, and the pivot 111 penetrates through the pivotal hole 121 and the through hole 141, wherein each of the carriers 120 is pivotally mounted to the pivot 111 by each of the bearings 140. In this embodiment, each of the spacers 130 is positioned between each adjacent pair of the pivotal portions 124 for spacing apart the adjacent carriers 120 at an interval, and the spacers 130 are replaceable for different requirements to adjust the interval between each adjacent pair of the carriers 120.

Figure 6:
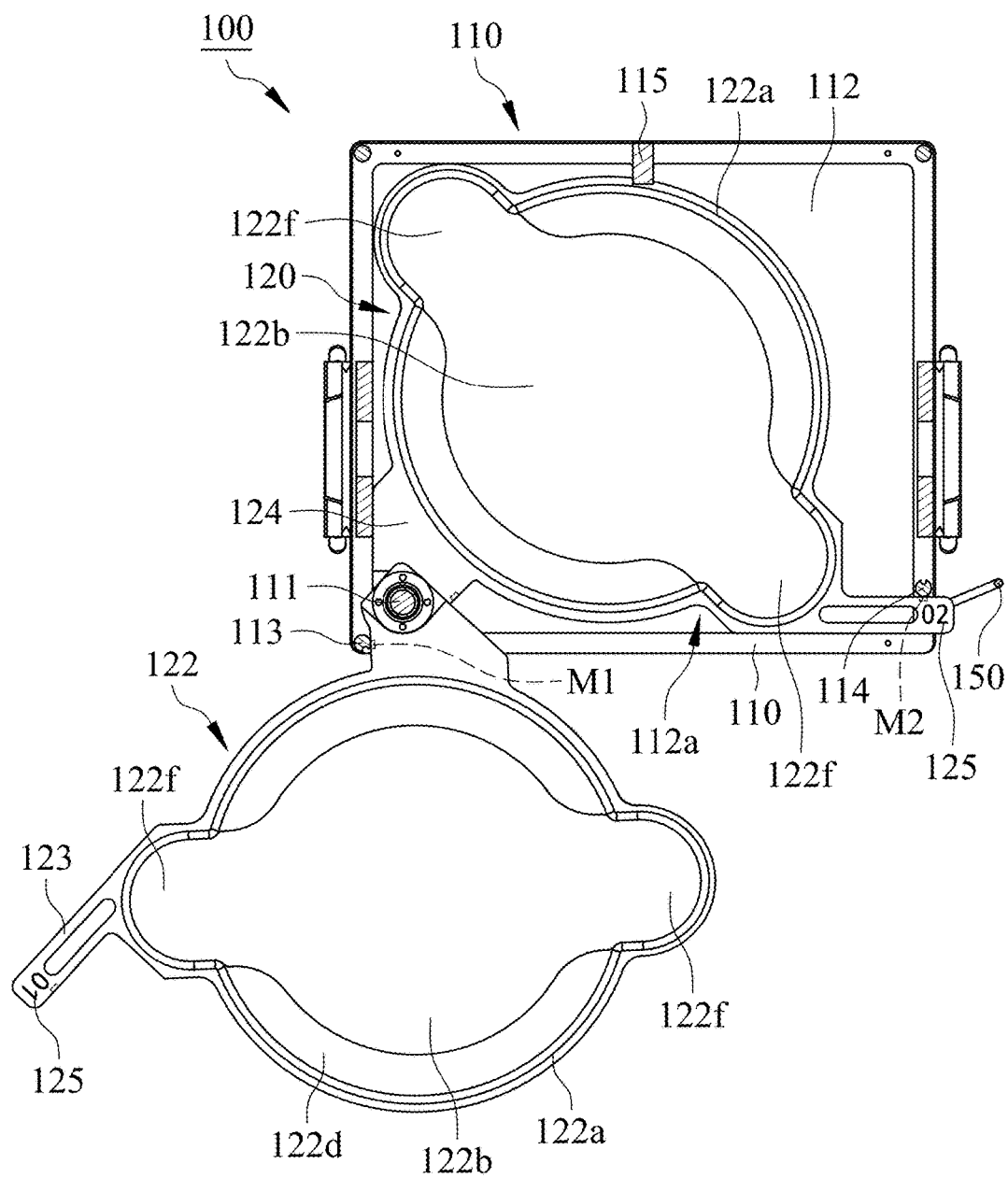
FIG. 6 is an operation diagram illustrating the wafer cassette in accordance with the embodiment of the present invention.

With reference to FIGS. 2, 5 and 6, the case 110 includes a first restricting rod 113, and the pivotal portion 124 is stopped by the first restricting rod 113 when the carrier 120 pivots around the pivot 111 to lead the carrying base 112 to depart from the accommodation space 112. In this embodiment, a first magnetic component M1 is disposed on the pivotal portion 124, and the pivotal portion 124 can be positioned on the first restricting rod 113 by the first magnetic component M1 when the pivotal portion 124 is stopped by the first restricting rod 113, so as to prevent the carrying base 122 from moving back to the accommodation space 112 due to improper external force pushing the carrier 120, and prevent the carrier 120 from swaying to cause the wafer W falling down.

With reference to FIGS. 1 and 2, each of the carriers 120 includes a handle portion 123 which connects with the frame 122a of the carrying base 122 in this embodiment, wherein the handle portion 123 is available for the operator to handle and move the carrier 120 for selectively swinging. Preferably, the mark 125 is located on the handle portion 123.

With reference to FIG. 3, the frame 122a includes a first opening 122c and an internal side surface 122e, wherein the internal side surface 122e is an oblique side surface facing toward the first opening 122c in this embodiment. The first opening 122c communicates with the accommodation groove 122b which is used for accommodating the wafer W. In this embodiment, the first opening 122c is substantially a circular opening, and it is not smaller in diameter than the wafer W. Preferably, the carrying base 122 includes a carrying plate 122d for carrying the wafer W, wherein the carrying plate 122d connects with the frame 122a and is located in the accommodation groove 122b.

With reference to FIGS. 2, 5 and 6, the frame 122a includes at least one loading/unloading hole 122f in this embodiment, wherein the loading/unloading hole 122f laterally communicates with the accommodation groove 122b. When the operator intends to load or unload the wafer W, the loading/unloading hole 122f is provided for the operator to load the wafer W on the carting base 122 or unload the wafer W from the carrying base 122 safely.

With reference to FIGS. 1, 2 and 5, the case 110 includes a second restricting rod 114, and the accommodation space 112 includes a second opening 122a, wherein the second opening 112a is located between the pivot 111 and the second restricting rod 114. And the handle portion 123 is stopped by the second restricting rod 114 and located outside of the accommodation space 112 when the carrying base 122 accommodates in the accommodation space 112.

With reference to FIGS. 2, 5 and 6, a second magnetic component M2 is disposed on the handle portion 123 in this embodiment. While the carrying base 122 accommodates in the accommodation space 112 and the handle portion 123 is stopped by the second restricting rod 114, the handle portion 123 can be positioned on the second restricting rod 114 by the second magnetic component M2, so as to prevent the carrying base 122 from departing from the accommodation space 112 caused by the improper force pushing the carrier 120.

With reference to FIGS. 1, 2, 4 and 5, the case 110 includes a supporting element 115 having a plurality of supporting parts 115a, wherein the supporting parts 115a are provided for supporting the carrying base 122 when the carrier 120 accommodates in the accommodation space 112. With reference to FIGS. 4 and 5, a triangle supporting frame (shown as the dot dash line in FIG. 5) is constituted by the pivot 111, the second restricting rod 114 and the supporting element 115 preferably. When each of the carriers 120 pivots around the pivot 111 into the accommodation space 112 selectively, each of the carriers 120 can accommodate in the accommodation space 112 stably because the pivotal hole 121 is pivotally coupled to the pivot 111, the handle portion 123 is stopped by the second restricting rod 114, and the carrying base 122 is supported by the supporting element 115.

With reference to FIGS. 1, 2, 5 and 6, the wafer cassette 100 further comprises a stop rod 150 which is pivotally and movably mounted on the case 110. With reference to FIG. 5, when the carrying base 122 accommodates in the accommodation space 112, the handle portion 123 is restricted between the second restricting rod 114 and the stop rod 150 to prevent the carrying base 122 from departing from the accommodation space 112 because of improper external force. With reference to FIGS. 5 and 6, the operator can move the stop rod 150 away from the handle portion 123 when intending to move the carrying base 122, so as to push the carrying base 122 departing from the accommodation space 112 for benefit of the wafer W loading or unloading.

While this invention has been particularly illustrated and described in detail with respect to the preferred embodiments thereof, it will be clearly understood by those skilled in the art that is not limited to the specific features shown and described and various modified and changed in form and details may be made without departing from the spirit and scope of this invention.

What is claimed is:

1. A wafer cassette comprising:
    a case including a pivot and an accommodation space; and
    a plurality of carriers, wherein each of the carriers includes a pivotal hole and a carrying base for carrying a wafer, and each of the carriers is pivotally and movably mounted to the pivot through the pivotal hole, wherein each of the carriers selectively pivots around the pivot to lead the carrying base to accommodate in the accommodation space or depart from the accommodation space.

2. The wafer cassette in accordance with claim 1, wherein the carrying base includes a frame and an accommodation groove for accommodating the wafer, the frame surrounds the accommodation groove and includes a first opening, wherein the first opening communicates with the accommodation groove.

3. The wafer cassette in accordance with claim 2, wherein the first opening is substantially a circular opening which is not smaller in diameter than the wafer.

4. The wafer cassette in accordance with claim 3, wherein the carrying base includes a carrying plate for carrying the wafer, the carrying plate connects with the frame and is located in the accommodation groove.

5. The wafer cassette in accordance with claim 2, wherein an internal side surface of the frame is an oblique side surface facing toward the first opening.

6. The wafer cassette in accordance with claim 2, wherein each of the carriers includes a handle portion connecting with the frame of the carrying base.

7. The wafer cassette in accordance with claim 6, wherein the case includes a second restricting rod and the accommodation space includes a second opening located between the pivot and the second restricting rod, and wherein the handle portion is stopped by the second restricting rod when the carrying base accommodates in the accommodation space.

8. The wafer cassette in accordance with claim 7, wherein the handle portion is located outside of the accommodation space when the handle portion is stopped by the second restricting rod.

9. The wafer cassette in accordance with claim 7, wherein a second magnetic component is disposed on the handle portion, and the handle portion is positioned on the second restricting rod by the second magnetic component when the handle portion is stopped by the second restricting rod.

10. The wafer cassette in accordance with claim 2, wherein the case includes a first restricting rod and each of the carriers includes a pivotal portion connecting with the frame of the carrying base, the pivotal hole is located on the pivotal portion, and wherein the pivotal portion is stopped by the first restricting rod when the carrying base departs from the accommodation space.

11. The wafer cassette in accordance with claim 10, wherein a first magnetic component is disposed on the pivotal portion, and the pivotal portion is positioned on the first restricting rod by the first magnetic component when the pivotal portion is stopped by the first restricting rod.

12. The wafer cassette in accordance with claim 1, wherein the case includes a supporting element having a plurality of carrying parts, and wherein each of the supporting parts supports the carrying base when the carrier accommodates in the accommodation space.

13. The wafer cassette in accordance with claim 12, wherein the case includes a second restricting rod and the accommodation space includes a second opening located between the pivot and the second restricting rod, and wherein a triangle supporting frame is constituted by the pivot, the second restricting rod and the supporting element.

14. The wafer cassette in accordance with claim 1 further comprises a plurality of spacers, wherein each of the spacers is mounted on the pivot and positioned between each adjacent pair of the carriers.

15. The wafer cassette in accordance with claim 14, wherein each of the carriers includes a pivotal portion, and the pivotal hole is located on the pivotal portion, wherein each of the spacers is positioned between each adjacent pair of the pivotal portions.

16. The wafer cassette in accordance with claim 1 further comprises a plurality of bearings, wherein each of the bearings includes a through hole and is coupled with a pivotal portion of each of the carriers, and wherein the pivotal hole is located on the pivotal portion and corresponding to the through hole, and the pivot penetrates through the pivotal hole and the through hole.

17. The wafer cassette in accordance with claim 2, wherein the frame includes at least one loading/unloading hole which laterally communicates with the accommodation space.

18. The wafer cassette in accordance with claim 7 further comprises a stop rod pivotally and movably mounted on the case, wherein the handle portion is restricted between the second restricting rod and the stop rod when the carrying base accommodates in the accommodation space.

19. The wafer cassette in accordance with claim 1, wherein a mark is located on each of the carriers.

20. The wafer cassette in accordance with claim 19, wherein each of the carriers includes a handle portion, and the mark is located on the handle portion.

* * * * *